United States Patent
Sell et al.

(10) Patent No.: US 6,797,613 B2
(45) Date of Patent: Sep. 28, 2004

(54) PROCESS FOR DEPOSITING $WSI_x$ LAYERS ON A HIGH TOPOGRAPHY WITH A DEFINED STOICHIOMETRY

(75) Inventors: Bernhard Sell, Dresden (DE); Annette Sänger, Dresden (DE); Georg Schulze-Icking, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/196,698

(22) Filed: Jul. 16, 2002

(65) Prior Publication Data

US 2003/0013301 A1 Jan. 16, 2003

(30) Foreign Application Priority Data

Jul. 16, 2001 (DE) .......................................... 101 34 461

(51) Int. Cl.[7] ............................................. H01L 21/443
(52) U.S. Cl. ...................... 438/655; 438/649; 438/680; 438/683; 438/685
(58) Field of Search ................................. 438/649, 656, 438/737, 682, 680

(56) References Cited

U.S. PATENT DOCUMENTS

| | | | |
|---|---|---|---|
| 4,684,542 A | | 8/1987 | Jasinski et al. |
| 4,966,869 A | * | 10/1990 | Hillman et al. .............. 438/685 |
| 5,231,056 A | | 7/1993 | Sandhu |
| 5,643,633 A | * | 7/1997 | Telford et al. .......... 427/255.17 |
| 5,940,733 A | | 8/1999 | Beinglass et al. |
| 5,997,950 A | * | 12/1999 | Telford et al. ......... 427/255.392 |
| 6,124,202 A | | 9/2000 | Jeon et al. |
| 6,130,159 A | * | 10/2000 | Kang et al. .................. 438/680 |
| 6,221,771 B1 | * | 4/2001 | Ban et al. .................... 438/683 |
| 6,297,152 B1 | * | 10/2001 | Itoh et al. .................... 438/649 |
| 6,534,400 B2 | * | 3/2003 | Ahn et al. .................... 438/649 |
| 6,537,910 B1 | * | 3/2003 | Burke et al. ................. 438/680 |
| 6,573,180 B2 | * | 6/2003 | Won ............................. 438/655 |

FOREIGN PATENT DOCUMENTS

| | | |
|---|---|---|
| DE | 199 47 053 C1 | 5/2001 |
| EP | 0 591 086 A2 | 4/1994 |

\* cited by examiner

Primary Examiner—Michael Lebentritt
(74) Attorney, Agent, or Firm—Laurence A. Greenberg; Werner H. Stemer; Ralph E. Locher

(57) ABSTRACT

Tungsten silicide layers are formed on a substrate and a semiconductor component has deep trench capacitors with a filling of tungsten silicide. The tungsten silicide layers are deposited on the substrate at a temperature of less than 400° C. and at a pressure of less than 10 torr from the vapor phase. The vapor phase hs a tungsten-containing precursor substance and a silicon-containing precursor substance. The molar ratio of the silicon-containing precursor compound to the tungsten-containing precursor compound in the vapor phase is selected to be greater than 500.

8 Claims, 3 Drawing Sheets

PROCESS FOR DEPOSITING WSI$_x$ LAYERS ON A HIGH TOPOGRAPHY WITH A DEFINED STOICHIOMETRY

BACKGROUND OF THE INVENTION

Field of the Invention

The invention relates to a process for producing tungsten silicide layers and to a semiconductor component which comprises tungsten silicide layers of this type.

Tungsten silicide has hitherto been used as a filling material for contact holes and as a gate material for transistors in microchips. The tungsten silicide is deposited on a substrate, generally a silicon wafer, using a CVD (chemical vapor deposition) process. The deposition takes place at temperatures in the range from 500 to 600° C. at a chamber pressure of approximately 1 torr. Tungsten hexafluoride and dichlorosilane (DCS) are used as gaseous precursor substances. The WF$_6$:DCS ratio is selected in the range of 1:200. As a result of reaction between the precursor substances, surface layers are deposited during the production of gate electrodes, and these layers have a uniform composition considered over their volume. Even during the filling of contact holes which have a low aspect ratio, no or only slight fluctuations in the composition of the WSi$_x$ are observed over the volume. An aspect ratio is understood as meaning the ratio of the depth of a recess to the diameter of its openings. If the known process is used to deposit WSi$_x$ layers for filling recesses with a high aspect ratio, as is the case, for example, in the production of deep trench capacitors in DRAM memory modules, only very poor filling of the recess is achieved. During the deposition, the opening of the recess quickly becomes closed up and prevents the precursor substances from penetrating into the lower-regions of the recess. Furthermore, a considerable change in the stoichiometry of the tungsten silicide is observed during the deposition. Therefore, the composition of the tungsten silicide changes over the depth of the recess. The tungsten silicide is therefore not in a thermodynamic stable state. The result of this is that during completion of the semiconductor module in subsequent conditioning steps, either, in the case of a high tungsten content in the tungsten silicide, silicon migrates out of the substrate into the tungsten silicide layer or, in the case of a high silicon content in the tungsten silicide, silicon is separated out of the tungsten silicide. Both reactions lead to a deterioration in the properties of the semiconductor module.

SUMMARY OF THE INVENTION

It is accordingly an object of the invention to provide a method of depositing tungsten silicide layers which overcomes the above-mentioned disadvantages of the heretofore-known devices and methods of this general type and which allows deposition of tungsten silicide even in recesses with a high aspect ratio, while the stoichiometry exhibits only minor fluctuations over the volume of the tungsten silicide layer that has been deposited.

With the foregoing and other objects in view there is provided, in accordance with the invention, a process for producing a tungsten silicide layer, which comprises:

depositing a tungsten silicide layer on a substrate at a temperature of less than 400° C. and a pressure of less than 50 torr (preferably <20 torr, and specifically <10 torr) from a vapor phase with a tungsten-containing precursor substance and a silicon-containing precursor substance; and setting a molar ratio of silicon-containing precursor compound to tungsten-containing precursor compound in the vapor phase to greater than 500.

The process according to the invention is carried out at temperatures which are significantly lower than in the processes which are known from the prior art. Furthermore, the molar ratio of silicon-containing precursor substance to tungsten-containing precursor substance is selected to be significantly higher than in the known process. These measures make it possible to produce tungsten silicide layers with a high edge coverage even in recesses with a high aspect ratio. The term edge coverage is understood as meaning the ratio of the layer thickness of the tungsten silicide at the surface of the substrate to the layer thickness of the tungsten silicide at the lowest point in the recess. Furthermore, the tungsten silicide layers which have been deposited using the processes according to the invention have only slight fluctuations in the stoichiometry even in the case of structural elements which have a considerable depth in the wafer. This makes the tungsten silicide layers produced thermally stable, i.e. there are no changes in the composition of the tungsten silicide layer produced even during subsequent process steps wherein the wafer is conditioned at elevated temperature.

The inventors explain this effect by means of the mechanism which is outlined below. However, it should be understood that the mechanism is merely a theory and is not intended to restrict the scope of the invention. Substantially the three reactions which are outlined below take place during the deposition of a tungsten silicide layer:

$$SiH_2Cl_2 \rightarrow Si^5 + 2HCl \tag{I}$$

$$WF_6 + 4SiH_2Cl_2 \rightarrow WSi_2^5 + 8HCl + SiF_4 + SiF_2 \tag{II}$$

$$5WF_6 + 11SiH_2Cl_2 \rightarrow W_5Si_3^5 + 22HCl + 7SiF_4 + SiF_2 \tag{III}$$

In the processes which are known from the prior art, the deposition of the tungsten silicide takes place substantially in accordance with the reaction which is presented by equation (II). The deposition of the tungsten silicide takes place very quickly, so that the reaction takes place substantially in a diffusion-controlled manner. This means that, in the case of recesses with a high aspect ratio, the deposition of the tungsten silicide takes place substantially close to the upper opening of the recess, with the result that the latter quickly closes up, and only small quantities are deposited in the lower regions of the recess. If the deposition temperature is reduced, in order in this way to reduce the reaction rate, the relative share formed by the reaction presented by equation (III) rises. Reaction III has the lowest activation energy compared to the other reactions presented. This means that now, although an improved edge coverage is achieved, i.e. a tungsten silicide layer is produced even in the lower regions of the recess, at the same time the stoichiometry of the tungsten silicide layer shifts in favor of the tungsten component. This means that in subsequent conditioning steps silicon migrates from the wafer into the deposited tungsten silicide in order to achieve a thermodynamically stable state. This shift in the stoichiometry when using slow deposition of the tungsten silicide layer is now compensated for, according to the invention, by drastically increasing the proportion of the silicon-containing precursor compound in the vapor phase compared to the processes which are known from the prior art. As a result, there is an increased deposition of silicon at the low deposition temperature, resulting from a reaction presented by equation (I). In this way, it is possible to compensate for the increased tungsten content, so that a thermally stable tungsten silicide layer is obtained. The two measures according to the invention, (a) reducing the deposition temperature, and (b) increasing the proportion of the silicon-containing precursor substance in the vapor phase, mean that with the processes according to the invention it is for the first time possible to produce tungsten silicide layers which have only slight fluctuations in the stoichiometry over their entire volume and which are thermodynamically stable in recesses with a high aspect ratio.

The tungsten silicide layer which is deposited using the process according to the invention preferably has a composition $WSi_x$ wherein x is selected in the range from $2 \leq x \leq 3$. The composition of the tungsten silicide layer can be achieved by suitable selection of the deposition temperature and/or by changing the molar ratio of the gaseous precursor substances. The reaction parameters are dependent on the dimensioning and the aspect ratio of the recess wherein the tungsten silicide layer is to be deposited, and also on the equipment used for deposition. The precise reaction parameters can be determined by the person skilled in the art using suitable preliminary tests.

The tungsten-containing precursor compound used is preferably tungsten hexafluoride. This compound is already used for the production of tungsten silicide layers for gate electrodes, and consequently there is already experience of this compound for process management. The same applies to the silicon-containing precursor substance, for which it is preferable to use dichlorosilane. A further advantage is that in principle it is possible to use existing production facilities for the process according to the invention, and it is merely necessary to modify the reaction conditions for the deposition in accordance with the process according to the invention.

The deposition of the $WSi_x$ from the vapor phase can be carried out in such a manner that no carrier gas is added to the vapor phase in the deposition device. However, in practice it has proven advantageous for a carrier gas to be added to the vapor phase. The carrier gas used may be a noble gas, preferably argon, or another inert gas, for example gaseous nitrogen. Since a very high ratio of silicon-containing precursor substance to tungsten-containing precursor substance is selected, it is very difficult to add the tungsten-containing precursor substance, since it is only supplied to the deposition device in very small quantities. Therefore, it is advantageous for the tungsten-containing precursor substance to be diluted with the carrier gas.

The substrate used is preferably a silicon substrate, a silicon wafer being particularly preferred. The process according to the invention can also be used for the production of planar layers on the surface of the silicon substrate. However, its particular benefits arise especially if the substrate includes recesses, in particular recesses with an aspect ratio of more than 20. It is then possible to produce uniform tungsten silicide layers even in the lower regions of the recesses, i.e. in the sections of the recess which are arranged inside the substrate.

As has already been stated above, the process according to the invention can produce thermodynamically stable tungsten silicide layers even in recesses with a high aspect ratio. This leads to semiconductor components with improved properties. Therefore, the invention also relates to a semiconductor component comprising a silicon substrate wherein deep trench capacitors are formed, which have a filling of $WSi_x$, the deep trench capacitors having an aspect ratio of more than 20, an edge coverage of more than 50% and furthermore x being greater than 2 over the volume of the $WSi_x$ filling.

Other features which are considered as characteristic for the invention are set forth in the appended claims.

Although the invention is illustrated and described herein as embodied in a process for depositing $WSi_x$ layers on a high topography with a defined stoichiometry, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
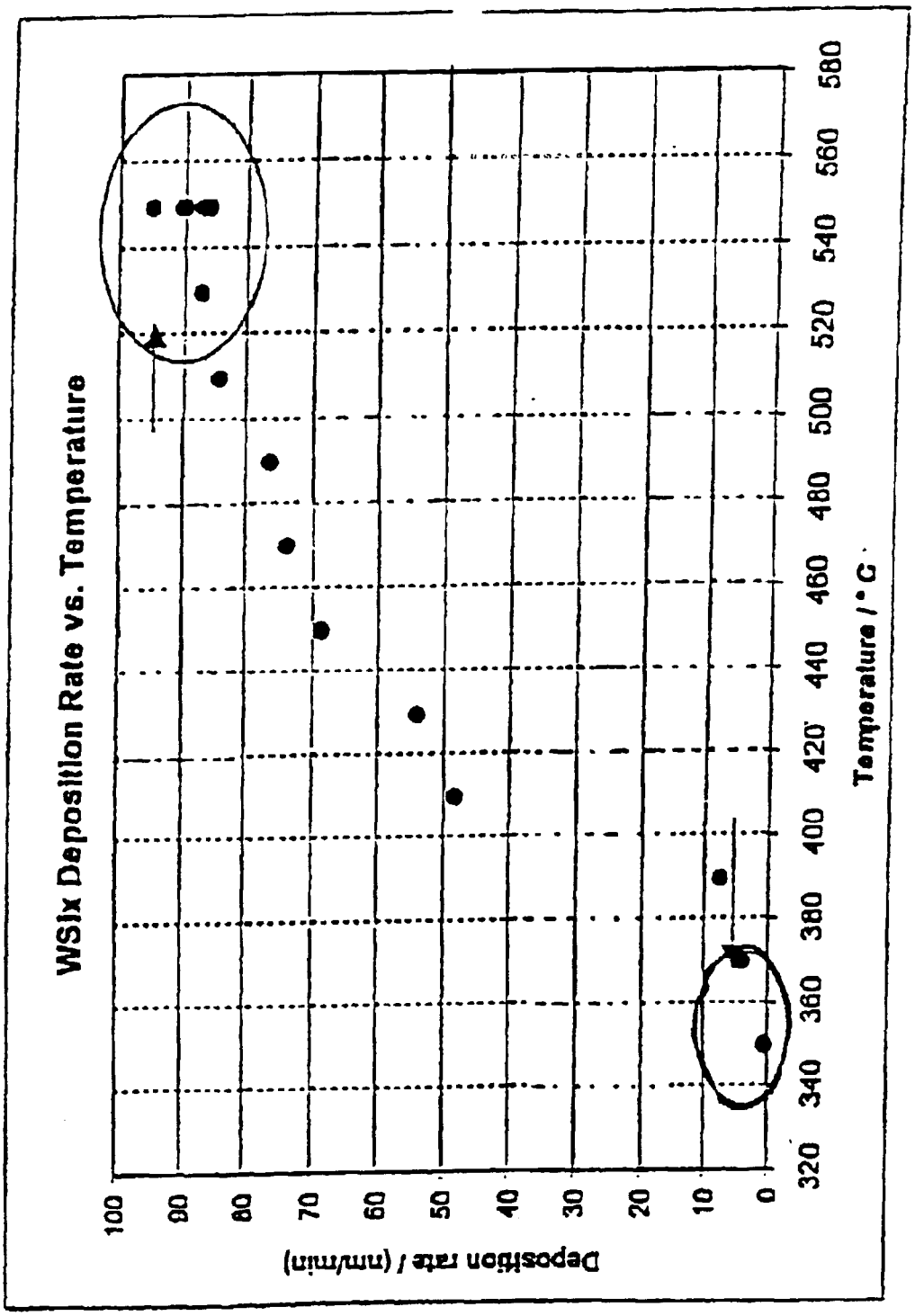
FIG. 1 shows a graph wherein the stoichiometric composition of a tungsten silicide layer is plotted as a function of the deposition temperature.

Referring now to the figures of the drawing in detail and first, particularly, to FIG. 1 thereof, there is shown the deposition rate of the tungsten silicide layer as a function of the deposition temperature. To produce this graph, layers of tungsten silicide were deposited at different temperatures on the surface of a silicon wafer, while the $WF_6$:$H_2SiCl_2$ ratio in the vapor phase above the silicon wafer was kept constant. At temperatures in the range from 520 to 560° C., the deposition takes place with a layer thickness growth in the range from 80 to 100 nm/min. The reaction is diffusion-controlled in this temperature range. By contrast, at temperatures in the range of less than 400° C., the reaction takes place with a considerably lower layer thickness growth of less than 10 nm/min. This slow deposition rate allows the layer thickness growth to be controlled very accurately, which is important in particular for the production of structures with a critical dimension of less than 100 nm. As explained above, at lower temperatures the reaction presented by equation (III) acquires a considerable significance, and consequently the tungsten content in the tungsten silicide layer increases. This is compensated for by a higher dichlorosilane content in the vapor phase.

Figure 2:
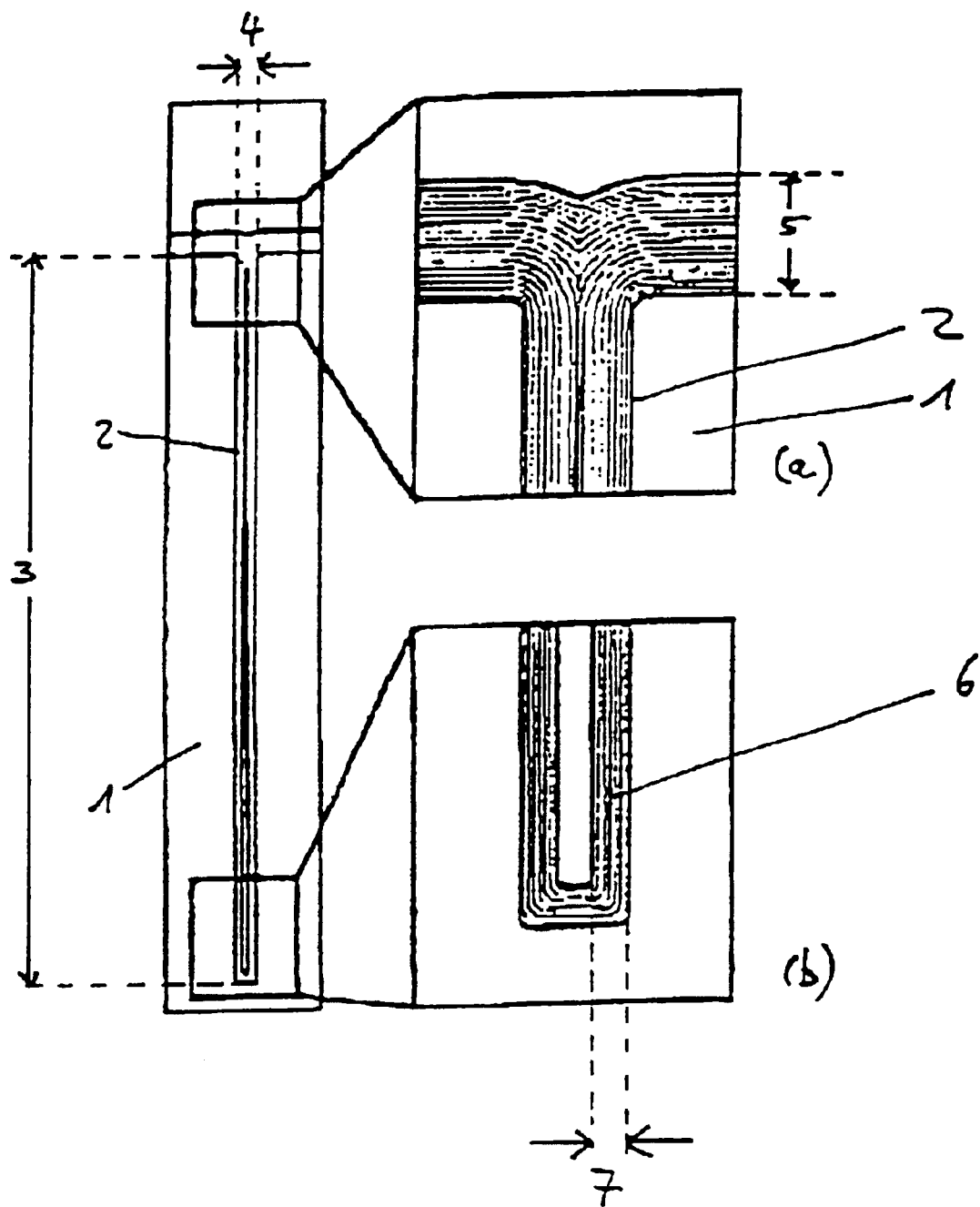
FIG. 2 diagrammatically depicts a deep trench capacitor which has been produced using the process according to the invention.

FIG. 2 shows a section through a deep trench capacitor that has been fabricated using the process according to the invention. For this purpose, first of all conventional methods were used to form recesses 2 in a silicon wafer 1, which recesses had an extent 3 in the depth of the substrate of 5 $\mu$m and a diameter 4 of the opening on the substrate surface of 100 nm. The aspect ratio, which is defined by the ratio of the depth extent 3 to the opening diameter 4, was therefore 50. Then, tungsten silicide was deposited, with the deposition temperature selected at 350° C. The $H_2SiCl_2$:$WF_6$ ratio was selected at 6000:1, and the chamber pressure was selected at 12 torr. (The partial pressure of the dichlorosilane was approximately 6 torr during the deposition). The deposition was carried out using argon as carrier gas. A tungsten silicide layer with an edge coverage of approximately 50% was obtained. The change in the layer thickness over the depth extent becomes clear from the detailed excerpts a and b from FIG. 2. Subfigure a shows the tungsten silicide layer at the surface of the substrate. The opening of the recess 2 has been completely filled, and the tungsten silicide layer has a layer thickness 5 on the surface of the substrate 1. Excerpt b shows the lower section of the deep trench capacitor. The wall of the recess 2 is covered with a tungsten silicide layer 6 which has a layer thickness 7. The term edge coverage is understood as meaning the ratio of the layer thickness 5 to the layer thickness 7. In the case of the deep trench capacitor illustrated, the edge coverage is more than 50%.

Figure 3:
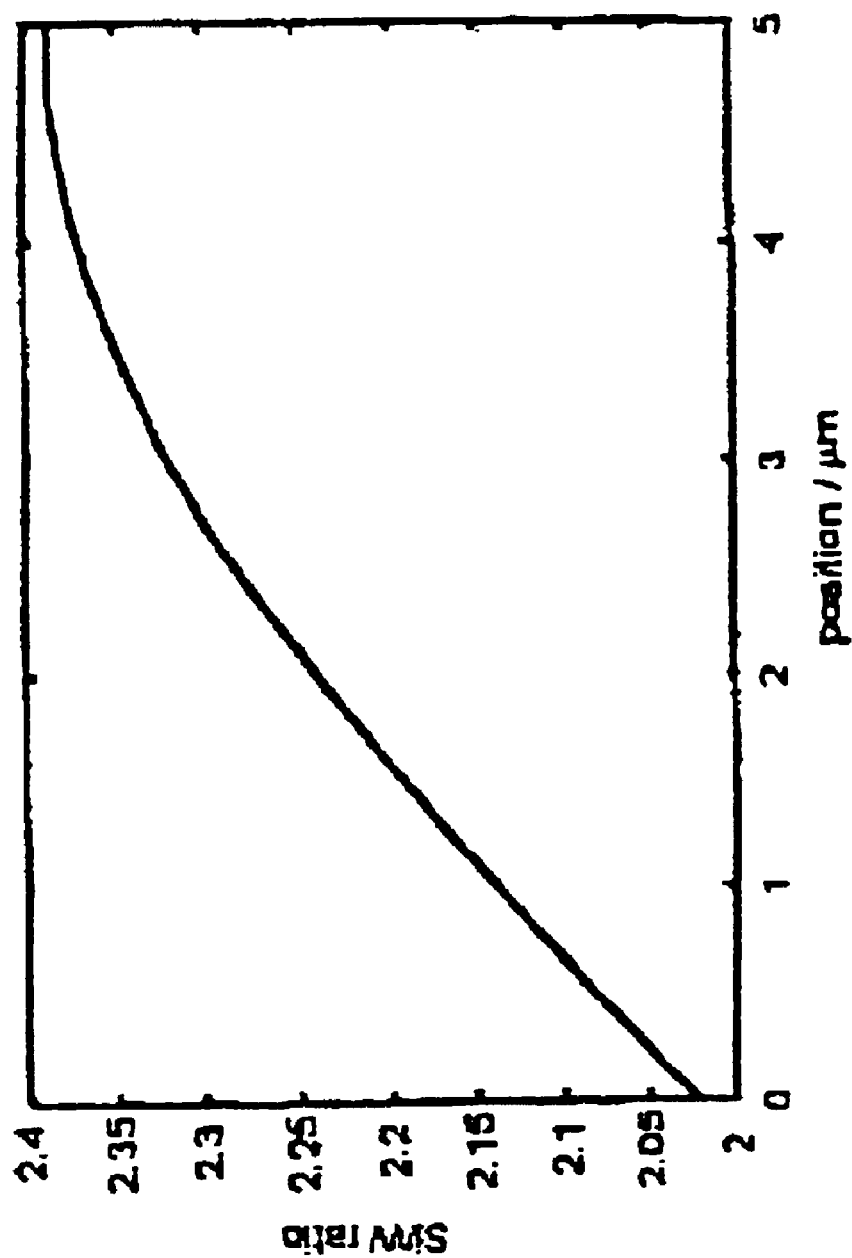
FIG. 3 shows a graph wherein the stoichiometric composition of the tungsten silicide layer is plotted as a function of the depth of the deep trench capacitor illustrated in FIG. 2.

The composition of the tungsten silicide layer as a function of the depth of the trench capacitor, i.e. along extent 3, is illustrated in FIG. 3. At the surface of the substrate, i.e. in the region which is indicated by excerpt a in FIG. 2, the Si/W ratio is approximately 2, the silicon content increasing slightly with increasing depth, so that the Si/W ratio in the lower region of the trench capacitor, which is represented by excerpt b in FIG. 2, rises up to a value of approximately 2.4. The change in the Si/W ratio is therefore very low, so that the tungsten silicide layer is in thermal equilibrium and there is no significant change in the structure of the trench capacitor during subsequent conditioning steps.

In general, the reaction conditions for the deposition of the tungsten silicide layer can be selected in the following ranges:

Temperature: <400° C., preferably 300° C. to 400° C.;
Pressure: >10 torr, preferably 10 to 15 torr;
$H_2SiCl_2$:$WF_6$:>500:1, preferably 1000:1.

We claim:

1. A process for producing a tungsten silicide layer, which comprises:

depositing a tungsten silicide layer on a substrate at a temperature of less than 400° C. and a pressure of loss than 50 torr from a vapor phase with a tungsten-containing precursor substance and a silicon-containing precursor substance; and setting a molar ratio of silicon-containing precursor compound to tungsten-containing precursor compound in the vapor phase to greater than 500.

2. The process according to claim 1, wherein the tungsten silicide layer has a composition $WSi_x$, where $2 \leq x \leq 3$.

3. The process according to claim 1, wherein the tungsten-containing precursor substance is tungsten hexafluoride.

4. The process according to claim 1, wherein the silicon-containing precursor substance is dichlorosilane.

5. The process according to claim 1, which comprises adding a carrier gas to the vapor phase.

6. The process according to claim 1, wherein the substrate is a silicon substrate.

7. The process according to claim 1, wherein the substrate has recesses formed therein.

8. The process according to claim 7, wherein the recesses have an aspect ratio of more than 20.

* * * * *